US008436500B2

(12) United States Patent
Minato

(10) Patent No.: US 8,436,500 B2
(45) Date of Patent: May 7, 2013

(54) SEMICONDUCTOR MODULE AND MOTORIZED EQUIPMENT USING THE SAME

(75) Inventor: Hideki Minato, Nagoya (JP)

(73) Assignee: Denso Corporation, Kariya (JP)

( * ) Notice: Subject to any disclaimer, the term of this patent is extended or adjusted under 35 U.S.C. 154(b) by 265 days.

(21) Appl. No.: 13/087,658

(22) Filed: Apr. 15, 2011

(65) Prior Publication Data
US 2011/0254411 A1 Oct. 20, 2011

(30) Foreign Application Priority Data

Apr. 16, 2010 (JP) .................................. 2010-94786

(51) Int. Cl.
*H02K 11/00* (2006.01)
(52) U.S. Cl.
USPC .......................... 310/68 C; 310/71; 310/68 D
(58) Field of Classification Search ..................... 310/43, 310/71, 68 C, 68 D, 64.68 R
See application file for complete search history.

(56) References Cited

U.S. PATENT DOCUMENTS

| 5,966,291 A * | 10/1999 | Baumel et al. ................ 361/707 |
| 6,166,464 A * | 12/2000 | Grant .......................... 310/68 R |
| 6,189,203 B1 * | 2/2001 | Heinrich et al. ................ 29/606 |
| 6,201,701 B1 * | 3/2001 | Linden et al. ................. 361/720 |
| 6,441,520 B1 * | 8/2002 | Grant .......................... 310/68 R |
| 6,577,030 B2 * | 6/2003 | Tominaga et al. .......... 310/68 B |
| 6,900,562 B2 * | 5/2005 | Derksen ...................... 310/68 R |
| 7,046,518 B2 | 5/2006 | Golightly et al. |
| 7,692,285 B2 | 4/2010 | Sato et al. |
| 7,969,000 B2 | 6/2011 | Sato et al. |
| 7,969,052 B2 * | 6/2011 | Ichise et al. ..................... 310/71 |
| 7,999,425 B2 * | 8/2011 | Utsumi et al. .............. 310/68 D |
| 2005/0167183 A1 | 8/2005 | Tominaga et al. |
| 2010/0102683 A1 * | 4/2010 | Utsumi et al. .............. 310/68 D |
| 2010/0181850 A1 * | 7/2010 | Ichise et al. ..................... 310/71 |

OTHER PUBLICATIONS

Matsuda et al, U.S. Appl. No. 13/087,670, filed Apr. 15, 2011.
Yamasaki, U.S. Appl. No. 13/087,683, filed Apr. 15, 2011.
Japanese Office Action dated Jul. 27, 2012, issued in corresponding Japanese Application No. 2010-094786 with English translation.

* cited by examiner

Primary Examiner — Thanh Lam
(74) Attorney, Agent, or Firm — Nixon & Vanderhye PC

(57) ABSTRACT

In a power module having two systems of inverter circuits for driving an electric motor of a motorized equipment, a wiring board mounted with power transistors and shunt resistances is embedded in a plate-like mold section. A plurality of lands have radiation surfaces exposed from the mold section. The radiation surfaces of a first land row constituted by a first group of the lands are provided on the same plane and the same straight line, and the radiation surfaces of a second land row constituted by a second group of the lands are provided on the same plane and the same straight line. The radiation surfaces of the first and second land rows are in surface-to-surface contact with a heat sink through insulation radiation sheets to dissipate a heat generated by the power module.

14 Claims, 18 Drawing Sheets

SEMICONDUCTOR MODULE AND MOTORIZED EQUIPMENT USING THE SAME

CROSS REFERENCE TO RELATED APPLICATION

This application is based on and incorporates herein by reference Japanese Patent Application No. 2010-94786 filed on Apr. 16, 2010.

BACKGROUND OF THE INVENTION

1. Field of the Invention

The present invention relates to a semiconductor module and a motorized equipment having a controller, which includes the semiconductor module and which is arranged on one axial side of a shaft of an electric motor.

2. Description of Related Art

Conventionally, an electric power steering system for assisting steering, which is performed by a driver, has been publicly known. Generally, an inverter circuit for producing an alternating-current power from a direct-current power is used in a controller that controls drive of an electric motor in the electric power steering system. The inverter circuit is constructed by mounting electronic components such as semiconductor devices such as transistors, resistors and capacitors on a substrate. For example, Patent document 1 (JP-A-2005-212722) describes a power substrate that is applied to an electric power steering controller and that is mounted with semiconductor switching devices and the like.

In the conventional technology described in Patent document 1, a heat sink is provided to be in surface-to-surface contact with the power substrate. A heat generated by large-current components and wiring patterns on the power substrate is dissipated through the heat sink. The entire power substrate is in contact with the heat sink. Therefore, heat dissipation of elements having relatively high cooling priorities and heat dissipation of elements having relatively low cooling priorities are performed substantially equally. Therefore, if it is aimed to achieve a sufficient effect of the heat dissipation from the elements having the relatively high cooling priorities, there occurs a problem that a body size of the heat sink enlarges and weight of the heat sink increases. The cooling priority means a degree of necessity for cooling.

SUMMARY OF THE INVENTION

It is an object of the present invention to provide a semiconductor module capable of selectively dissipating heats of elements having high cooling priorities. It is another object of the present invention to provide a motorized equipment reducing its size and weight by using the semiconductor module.

According to a first example aspect of the present invention, a semiconductor module has a semiconductor chip, a wiring board, a mold section, a winding connection terminal, a control terminal and a plurality of lands. The semiconductor chip provides a switching element for switching energization of a winding related to drive of a motor. The wiring board is mounted with the semiconductor chip and has an energization route routed through the semiconductor chip. The mold section is formed from a resin in the shape of a plate such that the semiconductor chip and the wiring board are embedded in the mold section. The winding connection terminal extends from the wiring board to an outside of the mold section. The winding connection terminal is connected with the winding. The control terminal extends from the wiring board to the outside of the mold section. The control terminal is connected with a control board that controls the energization of the winding.

The plurality of lands are provided on a side of the wiring board opposite to the semiconductor chip. The lands have radiation surfaces exposed from the mold section and are capable of dissipating a heat, which is generated by the semiconductor chip, by establishing surface-to-surface contact between the radiation surfaces and a radiation member. The lands constitute a land row, in which the radiation surfaces are arranged on the same plane and on a straight line. The number of the land row is not limited to one. Rather, an arbitrary number of land rows may be provided.

Thus, the radiation surfaces of the multiple lands can selectively dissipate heats of elements that generate large amounts of heat and have high cooling priorities. In addition, the shape of an outline of the land row is simple. Therefore, the radiation member for establishing the surface-to-surface contact with the radiation surfaces of the multiple lands can be made by cutting a rectangular sheet member having a predetermined width to length corresponding to each land row and used. Thus, a manufacturing cost of the radiation member can be reduced.

According to a second example aspect of the present invention, the radiation surfaces are provided on the same plane. That is, in the case where the multiple land rows are provided, the radiation surfaces of all the land rows are arranged on the same plane. Accordingly, a thickness of the mold section can be uniformed and heights of the multiple lands protruding from the mold section can be uniformed. Therefore, a manufacturing efficiency is improved.

According to a third example aspect of the present invention, the lands are arranged along side portions of the wiring board. For example, an outline of the wiring board is formed substantially in the rectangular shape, and the multiple lands are arranged along long side portions of the wiring board to constitute two sets of land rows. Thus, when the semiconductor module is used for driving a two-system three-phase alternating current motor, each set of land row may be assigned to each system and two sets of land rows may be arranged along side portions facing each other. In this case, the arrangement can be grasped at a glance for each system, thereby providing excellent visibility.

According to a fourth example aspect of the present invention, the winding connection terminal extends from a side portion of the wiring board to an outside of a side surface of the mold section. For example, each of outlines of the wiring board and the mold section is formed substantially in the rectangular shape, and the winding connection terminal extends from a long side portion of the wiring board to an outside of a side surface of the mold section. The winding connection terminal is a connection terminal for a large current and has a large size. Therefore, since the winding connection terminal extends to the outside of the side surface of the mold section, assembly workability is improved.

According to a fifth example aspect of the present invention, in the semiconductor module, the plurality of lands constitute a land row, in which the radiation surfaces are arranged on the same plane and on an arc. The number of the land row is not limited to one. Rather, an arbitrary number of land rows may be provided. For example, the wiring board is formed in the round shape, and the radiation member is formed in the arc-like shape concentric with the wiring board. In the case where the semiconductor module is stacked on a round motor in an axial direction of the motor, shapes of outlines can be conformed to each other, so mountability is improved.

According to a sixth example aspect of the present invention, the radiation surfaces are provided on the same plane. That is, in the case where the multiple land rows are provided, the radiation surfaces of all the land rows are arranged on the same plane. Accordingly, a thickness of the mold section can be uniformed and heights of the multiple lands protruding from the mold section can be uniformed. Therefore, a manufacturing efficiency is improved.

According to a seventh example aspect of the present invention, the semiconductor module further has a shunt resistance that is mounted to the wiring board and embedded in the mold section for sensing a current flowing through the winding. The lands are provided on a side of the wiring board opposite to the shunt resistance and are capable of dissipating a heat generated by the shunt resistance. The shunt resistance is used for sensing a current flowing through the winding and for performing feedback control in the drive control of the motor. Therefore, the heat from the shunt resistance can be selectively dissipated in addition to the heat from the semiconductor chip.

According to an eighth example aspect of the present invention, a motorized equipment has a stator, a rotor, a control board, the semiconductor module, a radiation member and a heat sink. A winding is wound around the stator to form a plurality of phases. The rotor is provided radially inside the stator to be rotatable relative to the stator. The control board is provided on an axial side of the rotor along a plane perpendicular to an axis of the rotor for controlling energization of the winding. The radiation member is made of an insulative material in the shape of a sheet to be in surface-to-surface contact with the radiation surfaces of the plurality of lands of the semiconductor module. The heat sink is made of a thermally-conductive material to be in surface-to-surface contact with a side of the radiation member opposite to the semiconductor module. The heat sink is capable of receiving a heat generated by the semiconductor module. Failure or malfunction of elements of the semiconductor module due to temperature increase can be inhibited by the heat sink.

The radiation surfaces of the semiconductor module are provided to the wiring board mounted with the semiconductor chip and the shunt resistance having large heat generation amounts. Therefore, heats from the elements having high cooling priorities can be selectively dissipated. Therefore, a heat dissipation efficiency is improved as compared to the case where the heat dissipation of the entire substrate is performed equally, so a size and weight of the heat sink can be reduced. In addition, since the radiation member is made of the insulative material, short circuit between the multiple lands through the heat sink can be prevented.

According to a ninth example aspect of the present invention, the heat sink has a heat receiving section in surface-to-surface contact with the radiation member. The heat receiving section has a thickness greater than a board thickness of the semiconductor module. Since the portion contacting the multiple lands through the radiation member is thick, a volume necessary for receiving the heat can be secured effectively.

According to a tenth example aspect of the present invention, the heat sink has an outer wall on a winding connection terminal side. The outer wall is provided on a wiring board side with respect to a connection between the winding connection terminal and an extraction line of the winding. Thus, when connecting work of the winding connection terminal and the extraction line of the winding is performed from the heat sink side, an eyesight is not blocked by the outer wall of the heat sink, and work tools and the like do not interfere with the connecting work. Therefore, the assembly workability is improved.

The heat sink has a recess, which opens to face the semiconductor chip, in a portion other than the heat receiving section. When the semiconductor module has a component with a large body size such as an aluminum electrolytic capacitor or a choke coil, the component is accommodated in the recess. Thus, a space can be used effectively and a body size of the motorized equipment can be reduced.

BRIEF DESCRIPTION OF THE DRAWINGS

Features and advantages of embodiments will be appreciated, as well as methods of operation and the function of the related parts, from a study of the following detailed description, the appended claims, and the drawings, all of which form a part of this application. In the drawings:

DETAILED DESCRIPTION OF EXAMPLE EMBODIMENT

Hereafter, embodiments of the present invention will be described with reference to the drawings.

First Embodiment

Figure 5:
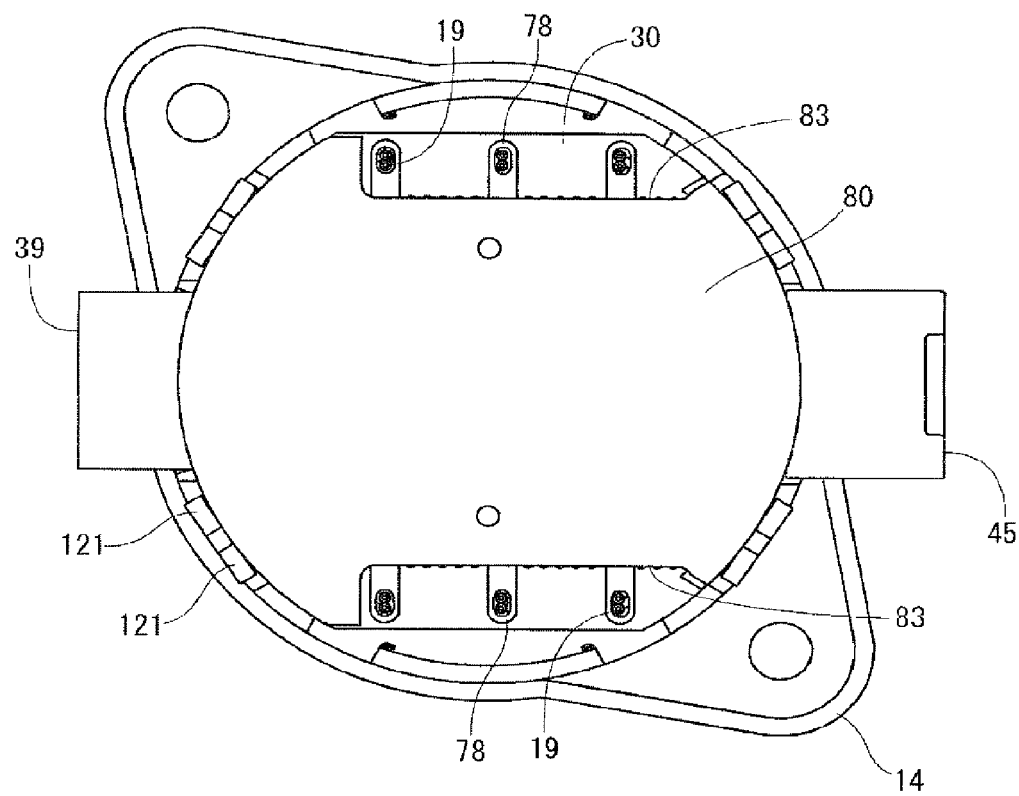
FIG. 5 is a view showing the motorized equipment of FIG. 2 along a direction of an arrow mark V.
Figure 6:
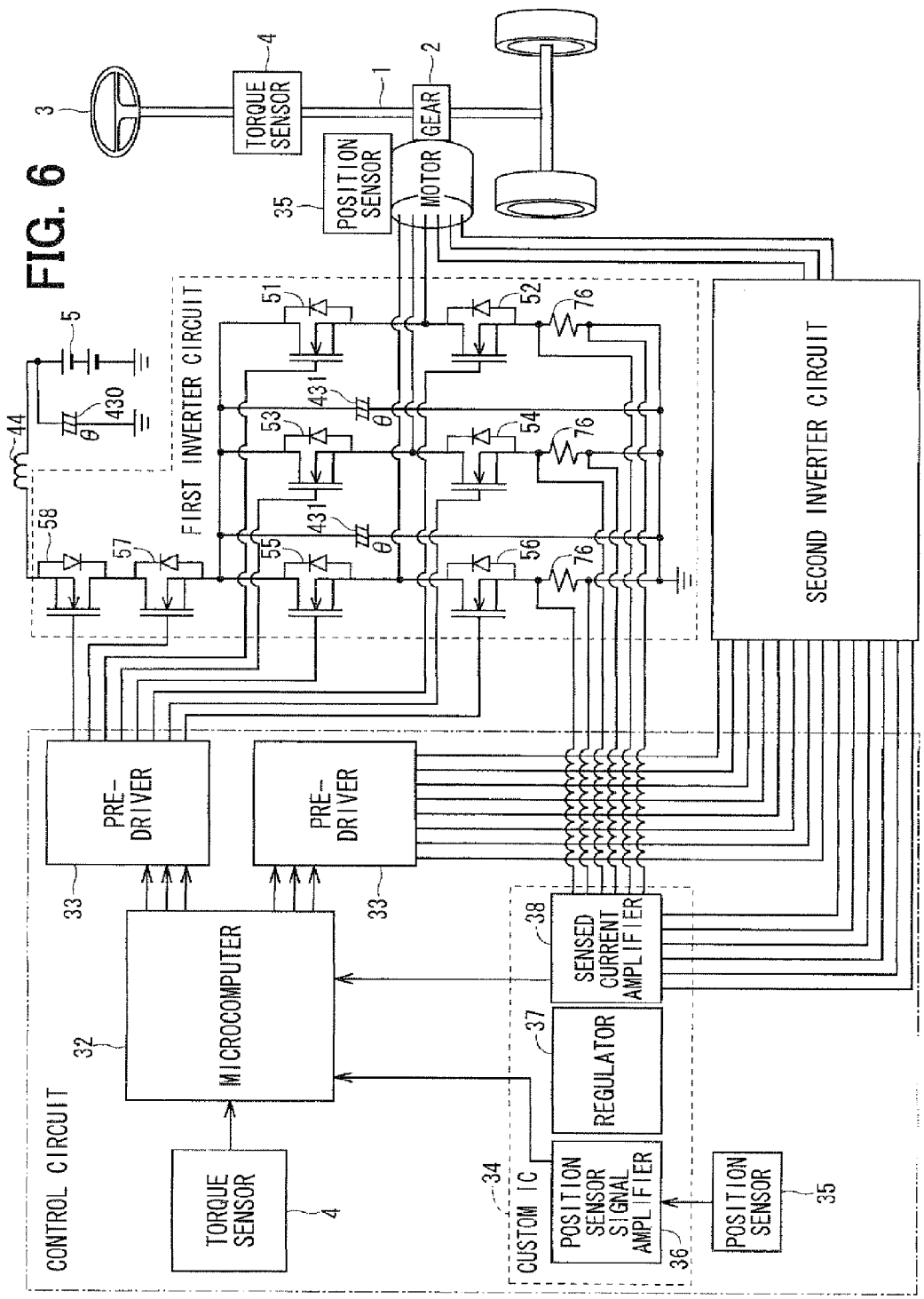
FIG. 6 is a circuit diagram showing the motorized equipment according to the first embodiment.

FIGS. 1 to 19 are diagrams each showing a motorized equipment according to a first embodiment of the present invention. The motorized equipment 10 according to the present embodiment is a brushless motor used for an electric power steering system. As shown in FIG. 6, the motorized equipment 10 meshes with a gear 2 of a column shaft 1. The motorized equipment 10 performs normal rotation and reverse rotation based on a vehicle speed signal, which is transmitted from CAN and the like, and a torque signal outputted from a torque sensor 4, which senses steering torque of a steering 3. Thus, the motorized equipment 10 generates a force for assisting steering.

Figure 1:
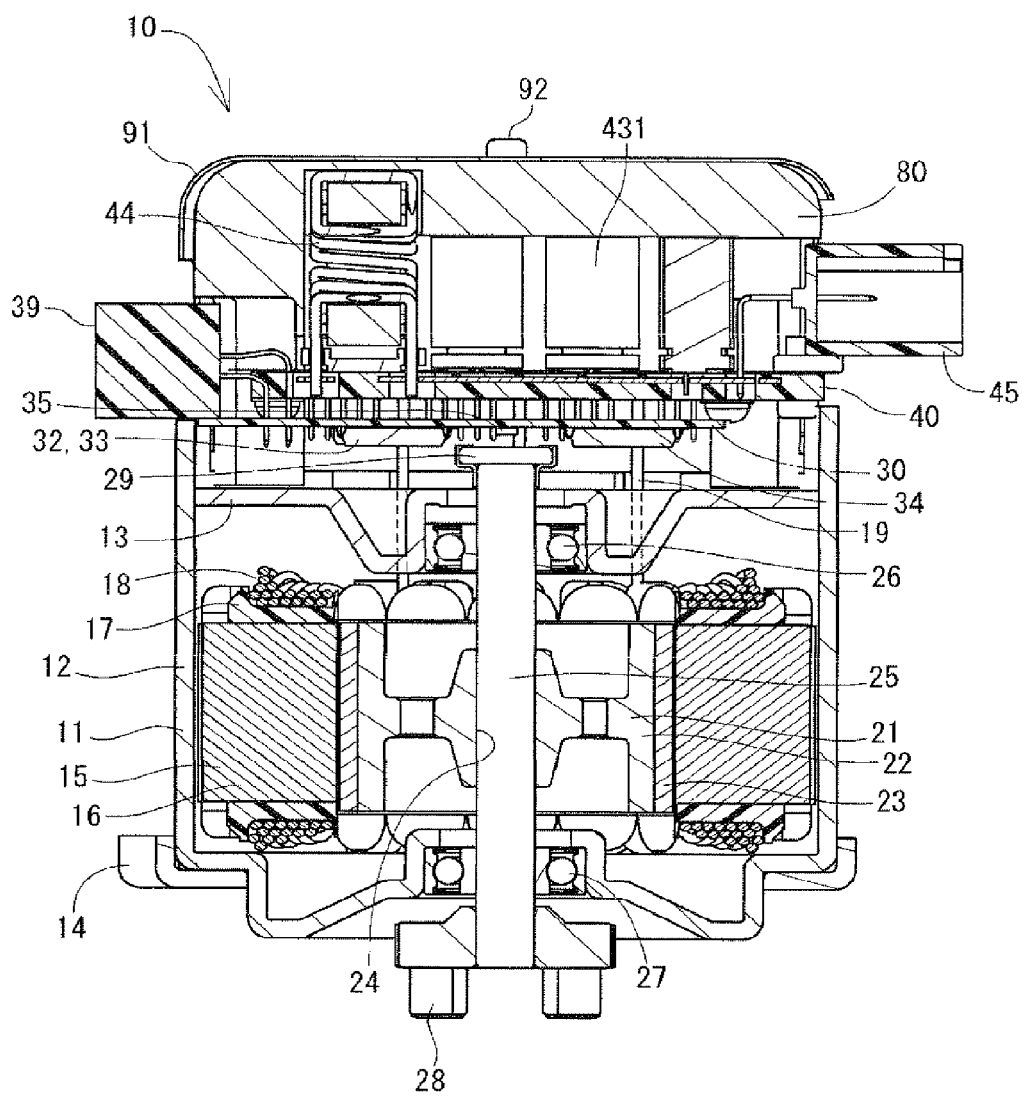
FIG. 1 is a cross-sectional view showing a motorized equipment according to a first embodiment of the present invention.
Figure 7:
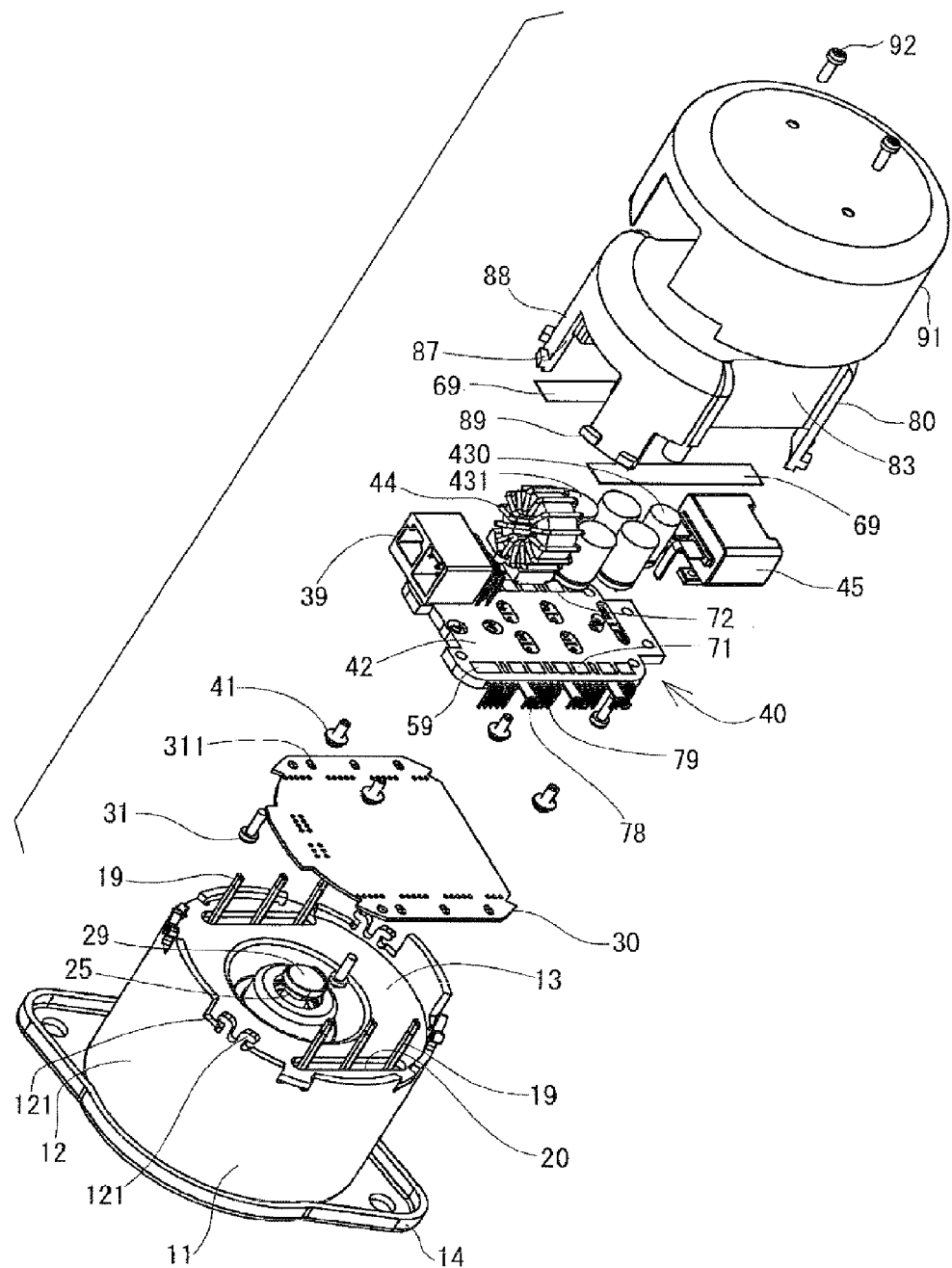
FIG. 7 is an exploded perspective view showing the motorized equipment according to the first embodiment.

FIG. 1 is a cross-sectional view showing the motorized equipment 10 according to the present embodiment. FIGS. 2 to 5 are views each showing outer appearance of the motorized equipment 10 according to the present embodiment. FIG. 7 is an exploded perspective view showing the motorized equipment 10 according to the present embodiment. The motorized equipment 10 has an electric motor and a controller. The electric motor is composed of a motor case 11, a stator 15, a rotor 21, a shaft 25 and the like. The controller is composed of a control board 30, a power module 40, a heat sink 80 and the like. Hereafter, a cover 91 side of the motorized equipment 10 (i.e., upper side in FIGS. 1 to 4) will be referred to as a top surface side. A frame end 14 side of the motorized equipment 10 (i.e., lower side in FIGS. 1 to 4) will be referred to as a bottom surface side.

First, the electric motor will be explained. The motor case 11 is made of iron or the like, for example. The motor case 11 consists of a first motor case 12 in the shape of a cylinder with bottom and a second motor case 13 blocking an opening of the first motor case 12 on a controller side. A frame end 14 made of aluminum is fixed to an outer wall of the bottom portion of the first motor case 12. The stator 15 is accommodated radially inside the first motor case 12. The stator 15 has salient poles 16 and slots (not shown) arranged alternately in a circumferential direction. Two systems of three-phase windings 18 are accommodated in the slots of the stator 15 across an insulator 17. The windings 18 are wound around the salient poles 16. Extraction lines 19 extending from the windings 18 pass through holes 20 formed in the second motor case 13 in a board thickness direction of the second motor case 13 and extend to the controller side.

The rotor 21 is rotatably provided radially inside the stator 15. The rotor 21 has a rotor core 22 and permanent magnets 23 provided radially outside the rotor core 22. The permanent magnets 23 are magnetized such that magnetic poles of the permanent magnets 23 alternate along a circumferential direction. The shaft 25 is fixed to a shaft hole 24 formed in a rotational center of the rotor 21. One axial end of the shaft 25 is fitted to a bearing 26 provided in the second motor case 13, and the other axial end of the shaft 25 is fitted to a bearing 27 provided in the bottom portion of the first motor case 12. With such the construction, if the windings 18 are energized, a rotational magnetic field is formed. Thus, the rotor 21 and the shaft 25 perform normal rotation or reverse rotation with respect to the stator 15 and the motor case 11. A drive force is outputted from an output end 28 of the shaft 25 on the frame end 14 side to the gear 2 of the column shaft 1.

Next, the controller that controls the drive of the electric motor will be explained. As shown in FIG. 7, the controller is constructed of the control board 30, the power module 40, the heat sink 80 and a cover 91, which are arranged in this order on one axial end side of the shaft 25 of the electric motor. The control board 30 and the power module 40 are fixed to the heat sink 80 respectively by screws 31, 41.

Next, the power module 40 will be explained with reference to FIGS. 6 and 8A to 13. The power module 40 constitutes two systems of inverter circuits for driving a three-phase alternating current motor. The power module 40 corresponds to a semiconductor module according to the present invention. The power module 40 is formed by performing resin insert molding of a wiring board 70 such that the wiring board 70 is embedded in a mold section 42. The wiring board 70 is formed substantially in a rectangular shape as shown in FIG. 13. The mold section 42 is formed substantially in the shape of a rectangular flat plate having rounded corners. The mold section 42 is indicated by broken lines in FIG. 13.

A construction on a bottom surface side of the wiring board 70 will be explained with reference to FIG. 13. A power connector 45 connected to a battery 5 is provided on a side of the wiring board 70 with respect to a longitudinal direction of the wiring board 70. A power supply line 750 is provided along a longitudinal symmetrical axis, and another power supply line 751 is provided on a short side opposite to the power connector 45. High potential lines 752, 753 are provided outside the power supply line 750 with respect to the symmetrical axis. A ground line 754 is provided outside the high potential lines 752, 753. One terminal of the power connector 45 is connected to the power supply line 750, and the other terminal of the power connector 45 is connected to the ground line 754.

Mounting sections 73 for mounting respective elements are provided outside the ground line 754 along long side portions. The elements of the first system are mounted in a long side portion shown in a lower-right portion of FIG. 13. The elements of the second system are mounted in a long side portion shown in an upper-left portion of FIG. 13.

These elements are sixteen power transistors 51-58, 61-68 and six shunt resistances 76. The power transistors 51-56 of the first system constitute the three-phase inverter circuit. The power transistors 57, 58 of the first system protect the circuit. The power transistors 61-66 of the second system constitute the three-phase inverter circuit. The power transistors 67, 68 of the second system protect the circuit. The power transistors 51, 53, 55, 61, 63, 65 are power transistors on a power supply side. The power transistors 52, 54, 56, 62, 64, 66 are power transistors on a ground side. The power transistors 51-58, 61-68 correspond to semiconductor chips according to the present invention. The shunt resistances 76 are used for sensing currents of respective phases in the respective systems. A circuit diagram of the inverter circuit of the second system is omitted in FIG. 6.

The power supply line 751 is connected to the high potential line 752 via the power transistors 57, 58 of the first system. The power supply line 751 is connected to the high potential line 753 via the power transistors 67, 68 of the second system. The jumper wirings 77 connect the high potential lines 752, 753 and the respective mounting sections 73 of the power supply side power transistors 51, 53, 55, 61, 63, 65. The shunt resistances 76 connect the respective mounting sections 73 of the ground side power transistors 52, 54, 56, 62, 64, 66 and the ground line 754.

Winding connection terminals 78 extend from the mounting sections 73 of the ground side power transistors 52, 54, 56, 62, 64, 66 to an outside of the mold section 42. Holes 781 are formed in the winding connection terminals 78. The extraction lines 19 of the windings 18 are passed through the holes 781 and are electrically connected with the winding connection terminals 78 by a welding process or a soldering process. A three-phase alternating current power is supplied from the winding connection terminals 78 to the windings 18. Control terminals 79 extend from the long side portions to the outside of the mold section 42. The control terminals 79 are electrically connected with the control board 30.

Figure 8A:
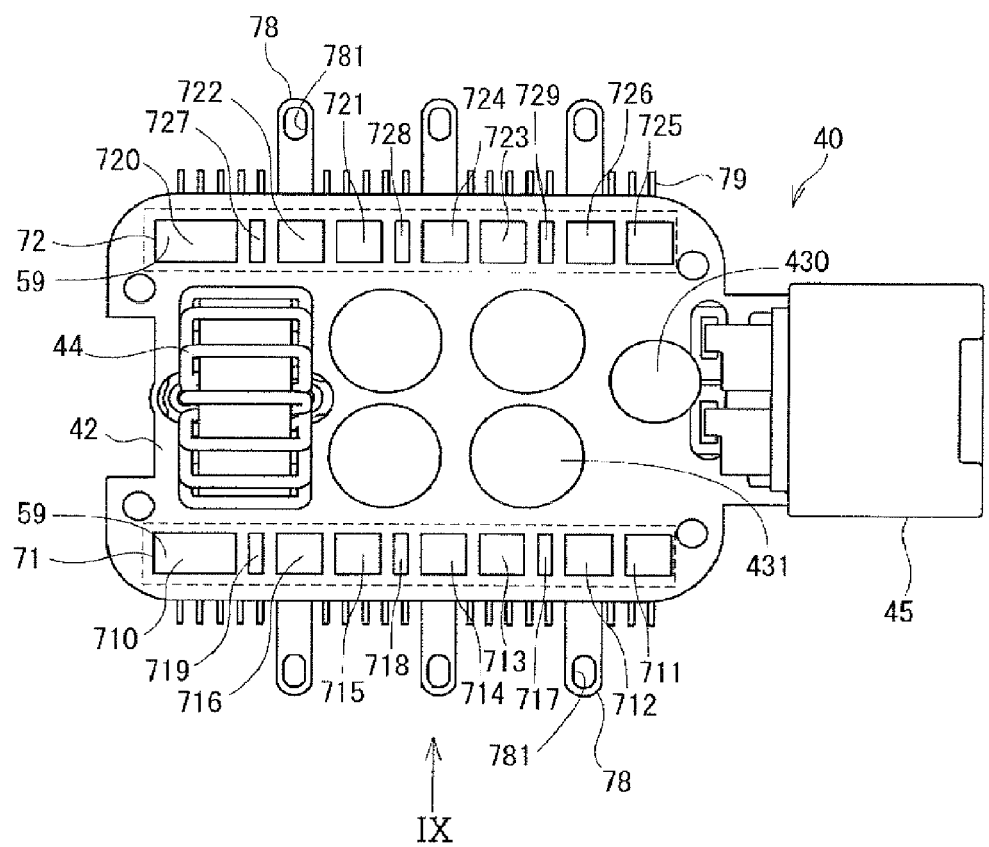
FIG. 8A is a plan view showing a power module and electronic components of the motorized equipment according to the first embodiment.
Figure 9:
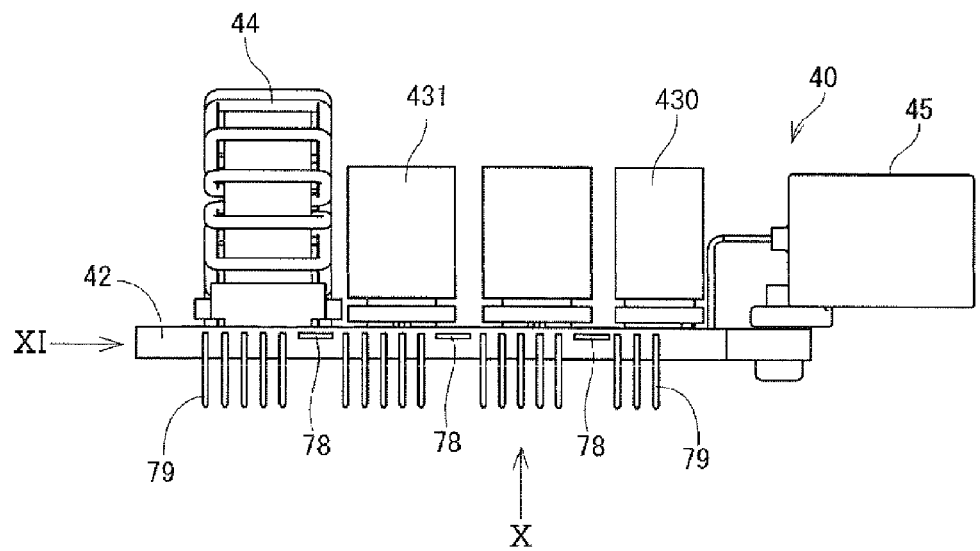
FIG. 9 is a view showing the power module and the electronic components of FIG. 8A along a direction of an arrow mark IX.
Figure 10:
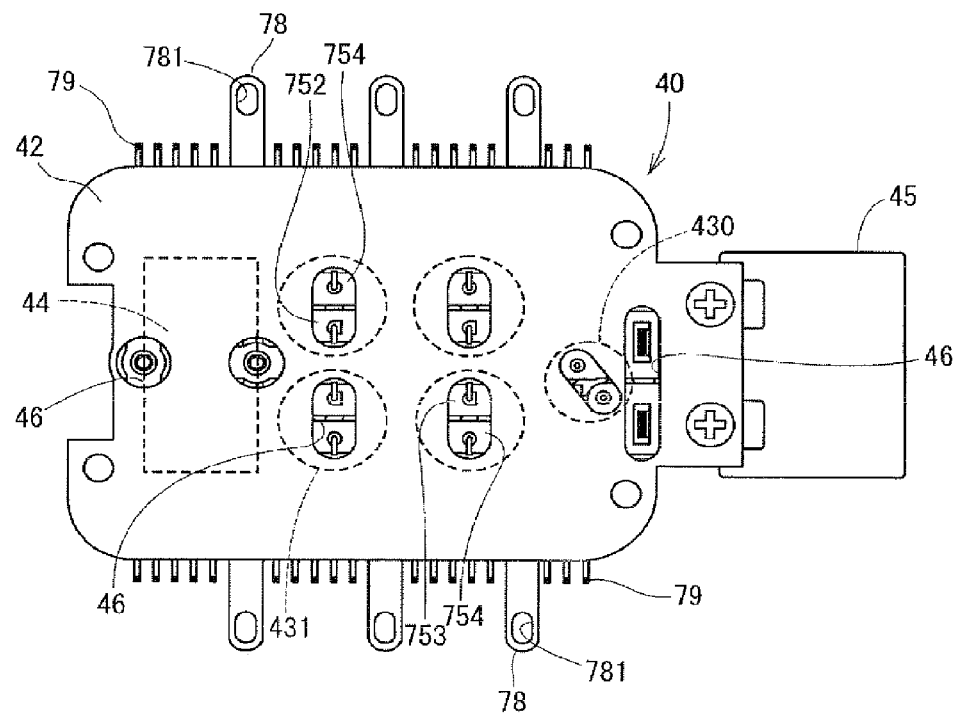
FIG. 10 is a view showing the power module and the electronic components of FIG. 9 along a direction of an arrow mark X.
Figure 11:
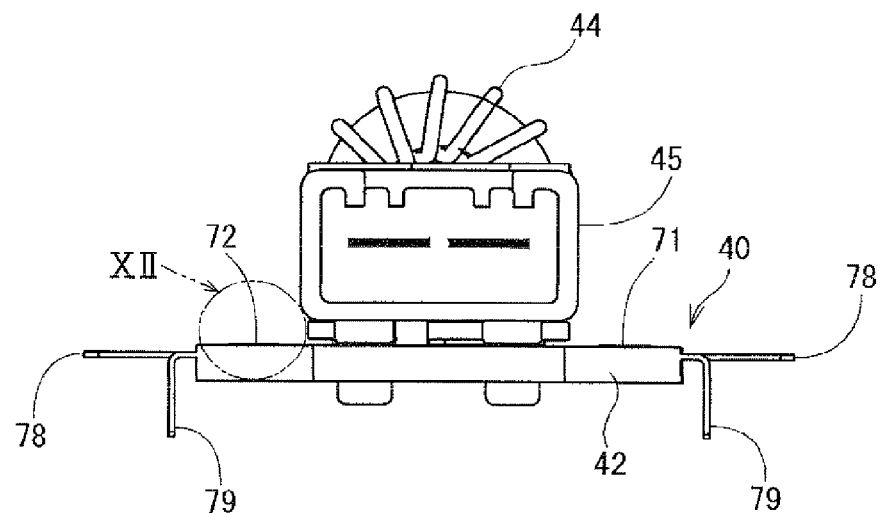
FIG. 11 is a view showing the power module and the electronic components of FIG. 9 along a direction of an arrow mark XI.

For example as shown in FIGS. 8A and 9, an aluminum electrolytic capacitor 430, four aluminum electrolytic capacitors 431 and a choke coil 44 are arranged near a central portion of the top surface side of the power module 40 with respect to a short side direction. The aluminum electrolytic capacitors 430, 431 and the choke coil 44 are mounted to the wiring board 70 through holes 46. The aluminum electrolytic capacitor 430 is connected between the power supply line 750 and the ground line 754 for smoothing a power supply noise. The aluminum electrolytic capacitors 431 are connected between the high potential lines 752, 753 and the ground line 754 for absorbing ripple currents, which are generated by operation of the power transistors 51-58, 61-68. The choke coil 44 is connected between the power supply lines 750, 751 for attenuating a fluctuation of the power supply.

A first land row 71 is arranged in the long side portion of the power module 40 along a lower side in FIG. 8A. A second land row 72 is arranged in the long side portion of the power module 40 along an upper side in FIG. 8A. The first land row 71 consists of a land 710 provided on a side opposite to the mounting section 73, on which the power transistors 57, 58 of the first system are mounted, lands 711-716 provided on a side opposite to the mounting sections 73, on which the power transistors 51-56 of the first system are mounted, and lands 717-719 provided on a side opposite to the mounting sections 73, on which the shunt resistances 76 of the first system are mounted. The second land row 72 consists of a land 720 provided on a side opposite to the mounting section 73, on which the power transistors 67, 68 of the second system are mounted, lands 721-726 provided on a side opposite to the mounting sections 73, on which the power transistors 61-66 of the second system are mounted, and lands 727-729 provided on a side opposite to the mounting sections 73, on which the shunt resistances 76 of the second system are mounted. The first and second land rows 71, 72 correspond to land rows according to the present invention.

Figure 12:
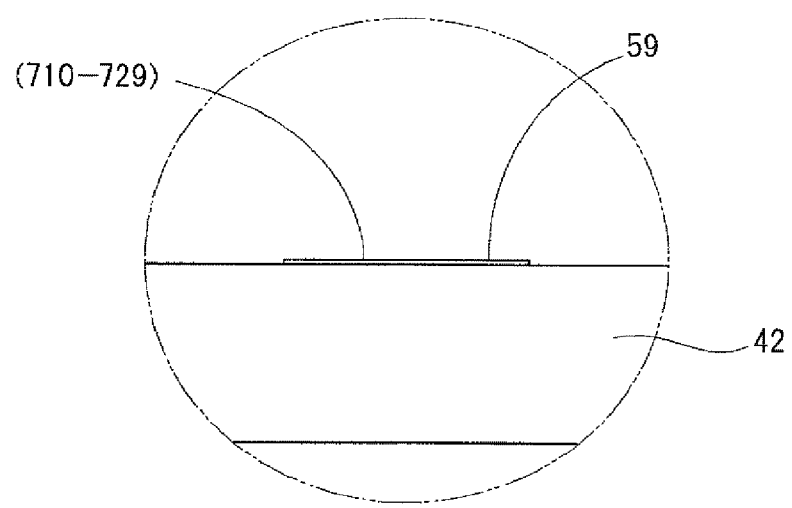
FIG. 12 is an enlarged partial view showing a part of the power module and the electronic components of FIG. 11 indicated by a circle XII.
Figure 13:
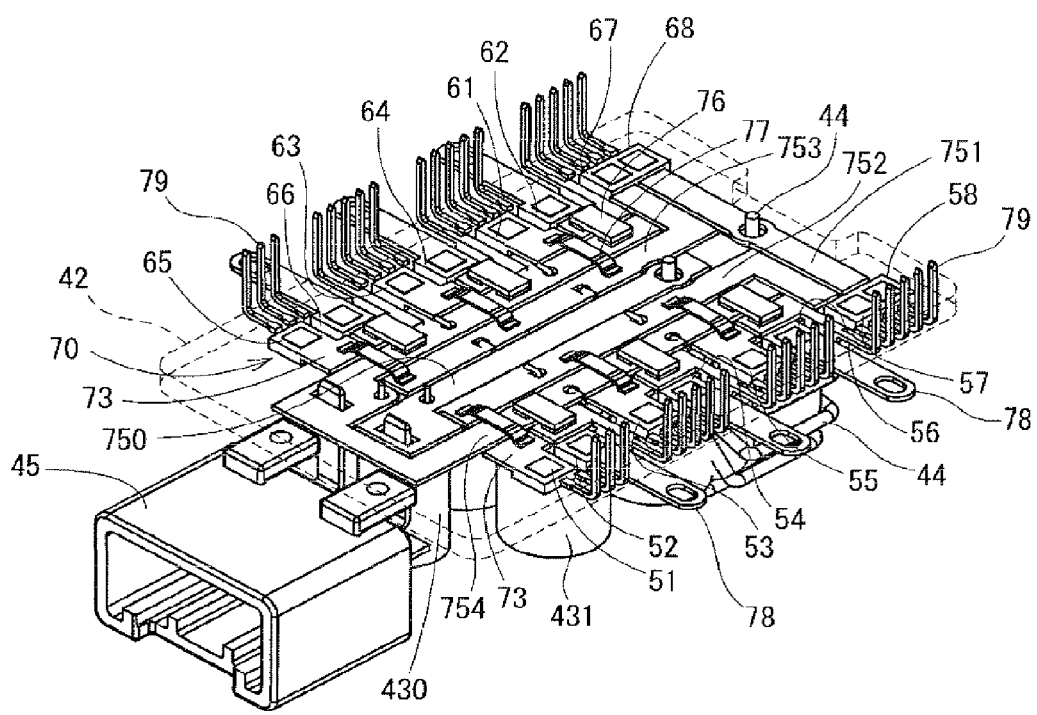
FIG. 13 is a perspective view showing the power module and the electronic components except a resin mold according to the first embodiment.

The lands 710-729 protrude in a board thickness direction of the mold section 42 and have radiation surfaces 59 exposed from the top surface side of the mold section 42 (refer to FIG. 12). The radiation surfaces 59 of the lands 710-719 constituting the first land row 71 are arranged on the same plane. The radiation surfaces 59 of the lands 720-729 constituting the second land row 72 are arranged on the same plane. In the first embodiment, the radiation surfaces 59 of the first land row 71 and the radiation surfaces 59 of the second land row 72 are arranged on the same plane. The lands 710-719 of the first land row 71 are arranged on the same straight line. The lands 720-729 of the second land row 72 are arranged on the same straight line.

Figure 2:
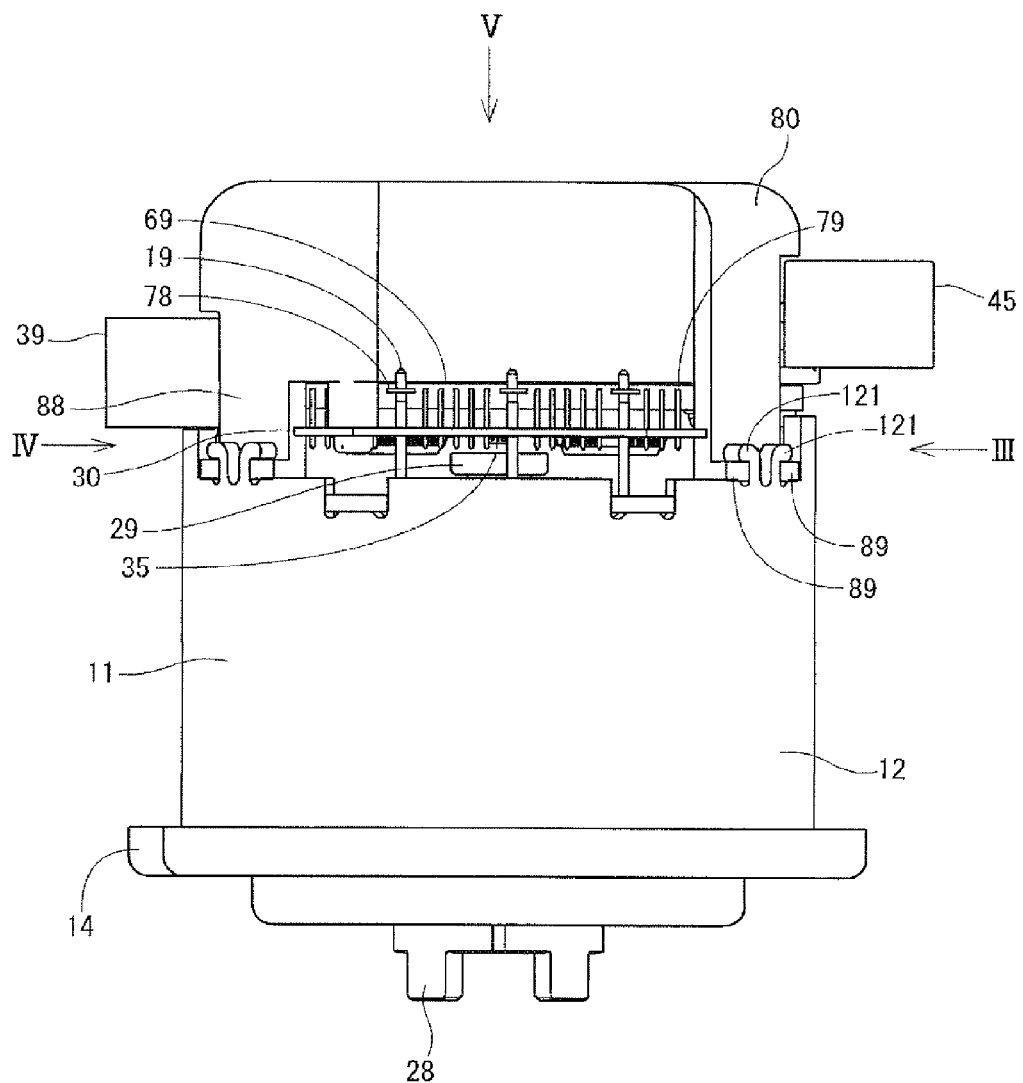
FIG. 2 is a side view showing the motorized equipment according to the first embodiment.
Figure 3:
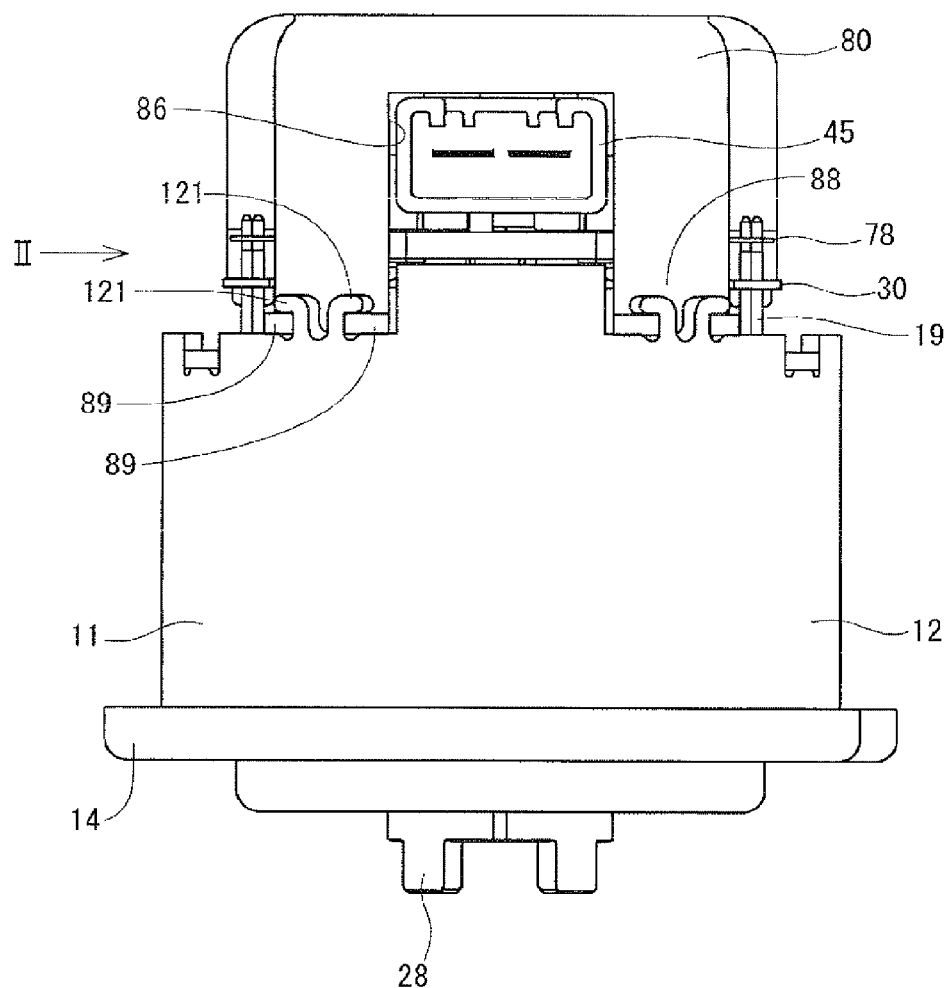
FIG. 3 is a view showing the motorized equipment of FIG. 2 along a direction of an arrow mark III.
Figure 4:
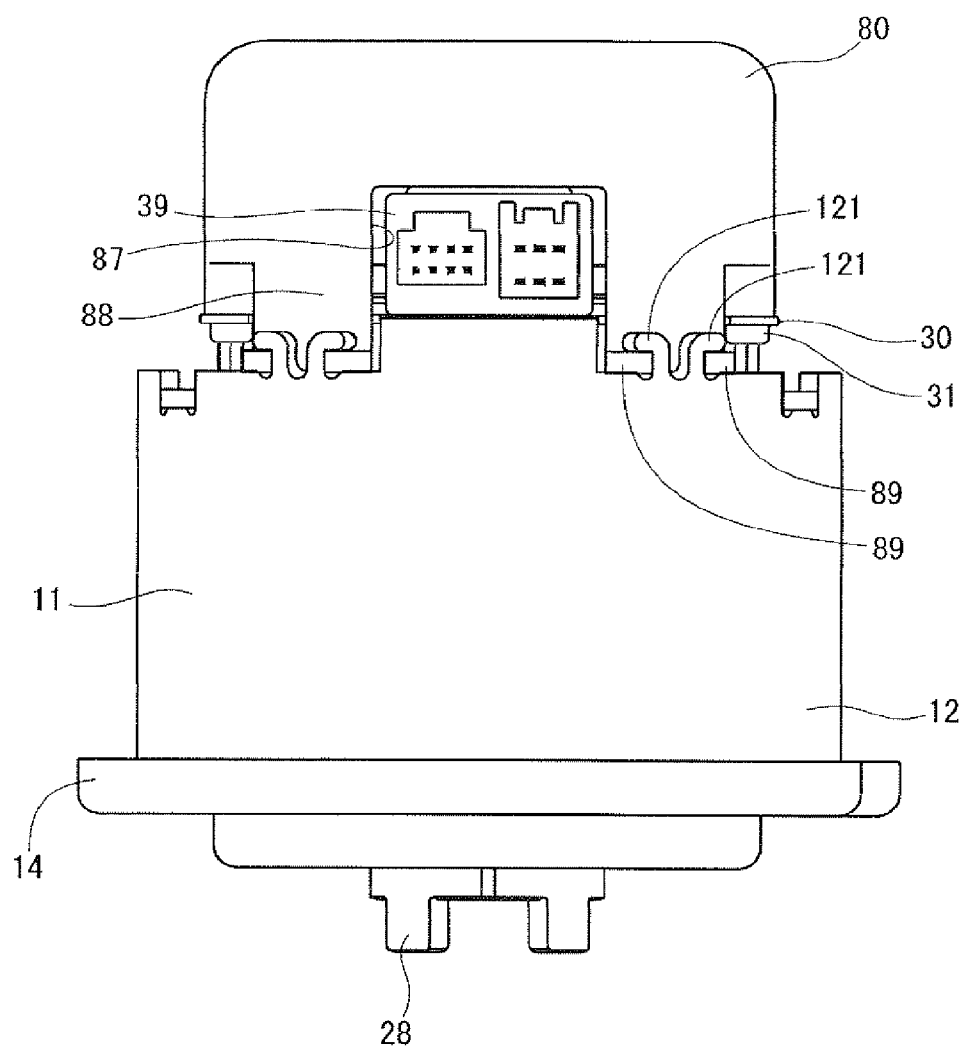
FIG. 4 is a view showing the motorized equipment of FIG. 2 along a direction of an arrow mark IV.
Figure 8B:
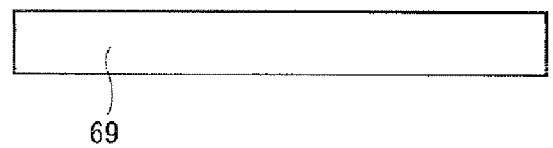
FIG. 8B is a plan view showing an insulation radiation sheet according to the first embodiment.

Each of insulation radiation sheets 69 is formed in the rectangular shape from an insulative material such as silicon. For example, each insulation radiation sheet 69 is formed by cutting a sheet material, which has a predetermined width corresponding to width of each of the land rows 71, 72, to length corresponding to length of each of the land rows 71, 72 as shown in FIGS. 8A and 8B. Surfaces of the insulation radiation sheets 69 on one side are in surface-to-surface contact with the radiation surfaces 59 of the land rows 71, 72 respectively. Surfaces of the insulation radiation sheets 69 on the other side are in surface-to-surface contact with the heat receiving sections 85 of the heat sink 80 as shown in FIG. 2. The insulation radiation sheet 69 corresponds to a radiation member according to the present invention.

Figure 14:
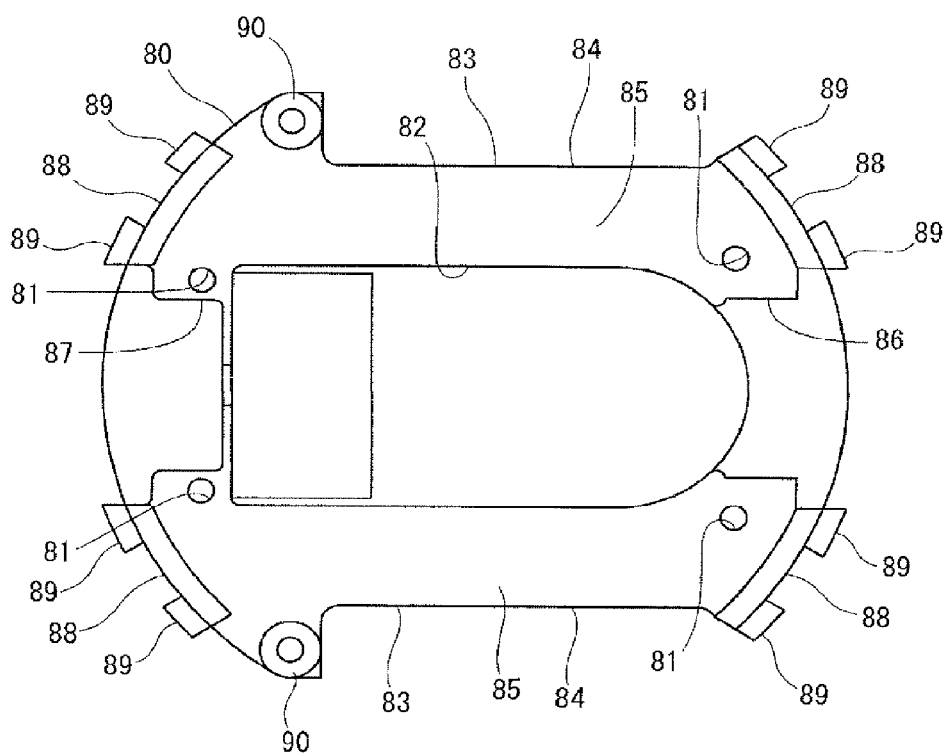
FIG. 14 is a bottom view showing a heat sink of the motorized equipment according to the first embodiment.
Figure 15:
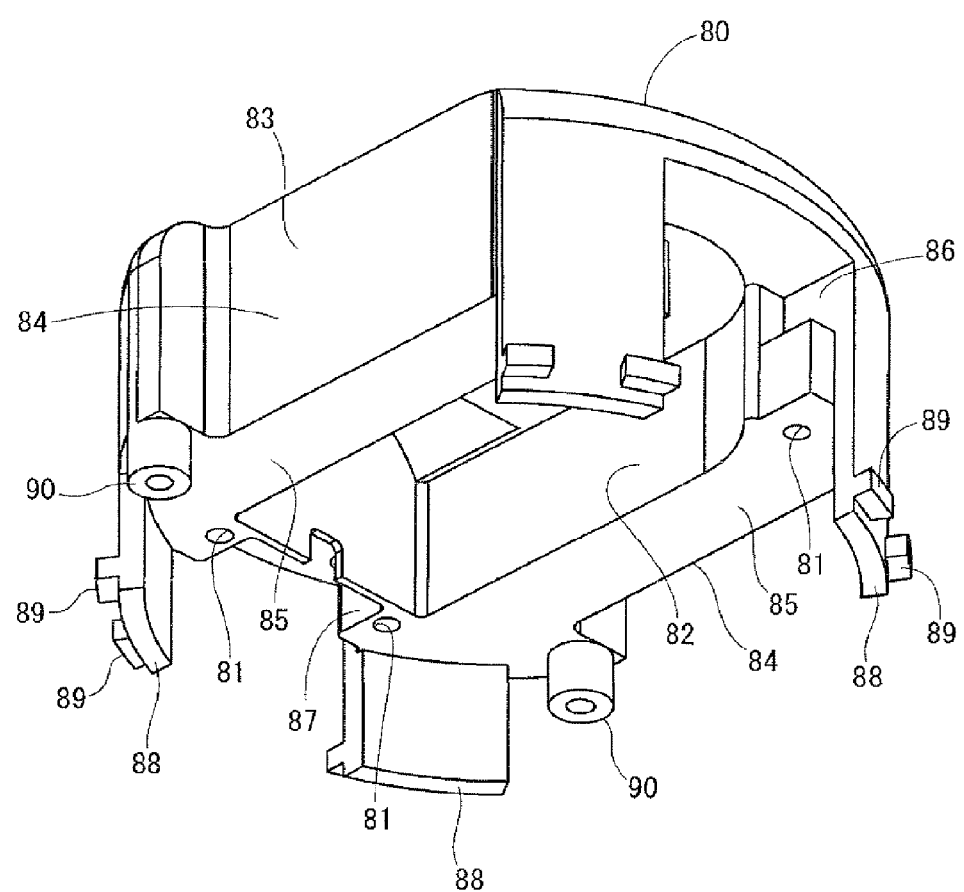
FIG. 15 is a perspective view showing the heat sink according to the first embodiment.

Next, the heat sink 80 will be explained with reference to FIGS. 14 and 15. The heat sink 80 is made of a thermally-conductive material such as the aluminum and has a volume capable of receiving the heat generated by the power module 40. The heat sink 80 has two columnar members 84 in longitudinal outer sides thereof. Thicknesses of the two columnar members 84 are greater than a board thickness of the power module 40. The heat receiving sections 85 are formed on bottom surface sides of the columnar members 84. The heat receiving sections 85 are in surface-to-surface contact with the insulation radiation sheets 69 and receive the heat generated by the power module 40 through the insulation radiation sheets 69.

The heat sink 80 has flat surface sections 83 substantially perpendicular to the heat receiving sections 85 at positions corresponding to positions of longitudinal side surfaces of the power module 40. That is, as shown in FIG. 5, the flat surface section 83 is provided on the wiring board 70 side with respect to the connections between the winding connection terminals 78 and the extraction lines 19 of the windings 18. Therefore, when the connections are seen from the top surface side, an eyesight is not blocked. A space for performing connecting work is secured. The flat surface section 83 corresponds to an outer wall on the winding connection terminal side according to the present invention.

Figure 16:
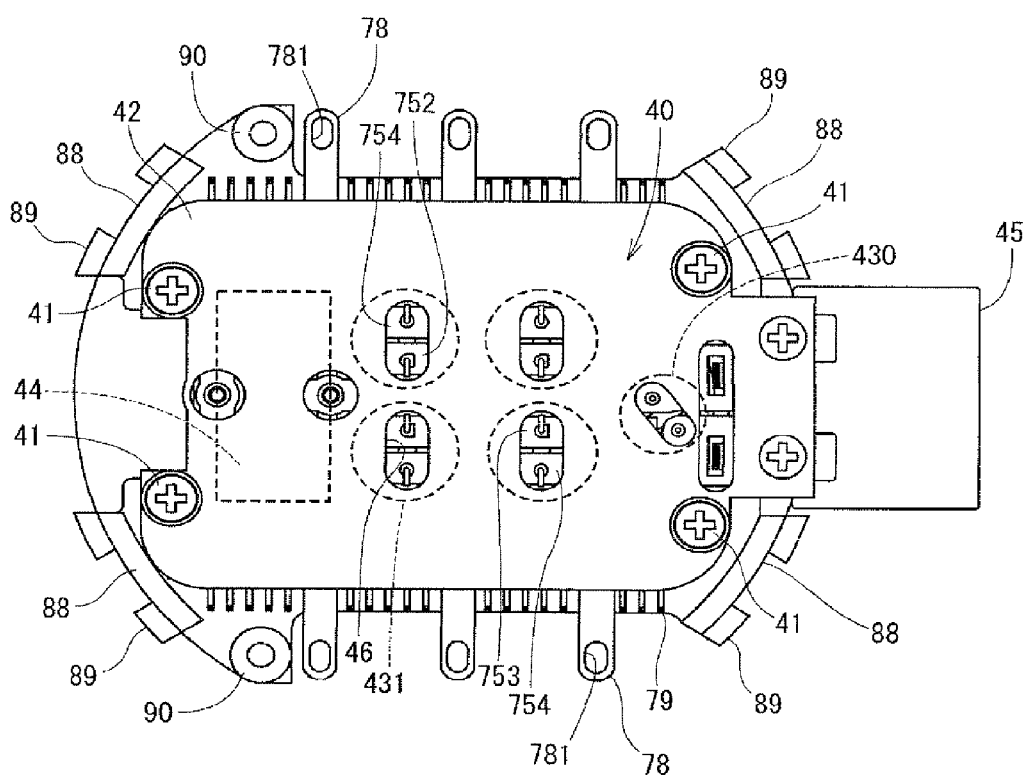
FIG. 16 is a bottom view showing the power module attached to the heat sink according to the first embodiment.
Figure 17:
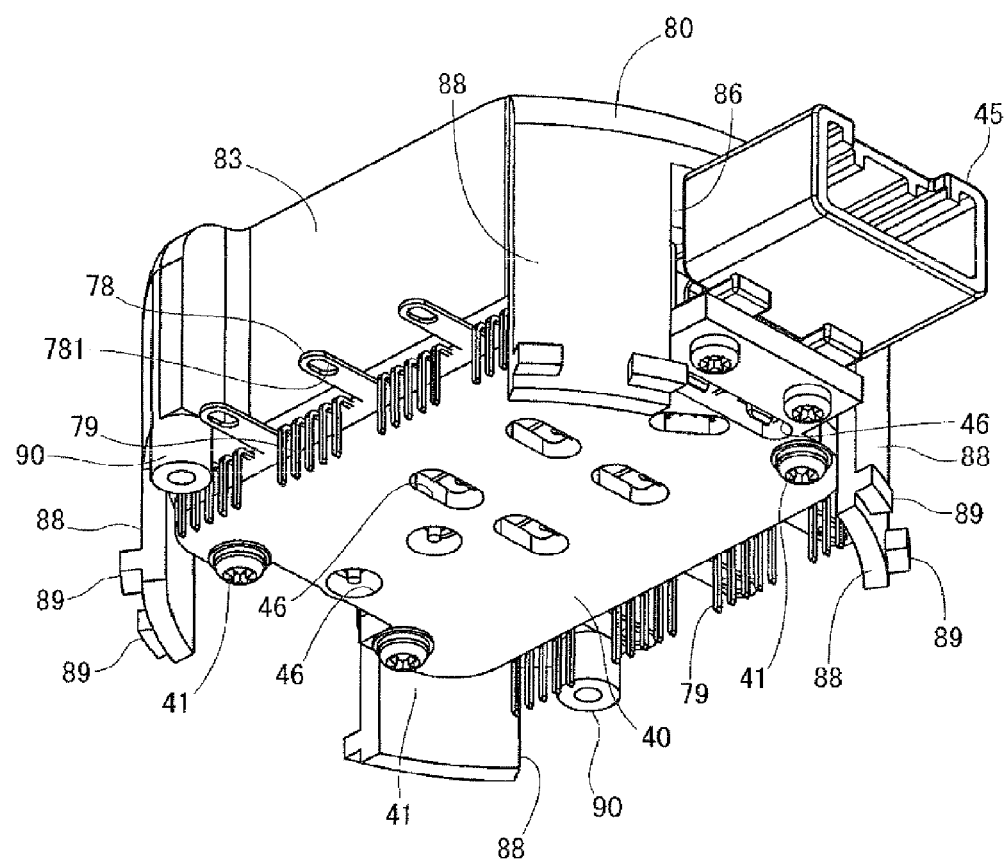
FIG. 17 is a perspective view showing the power module attached to the heat sink according to the first embodiment.
Figure 18:
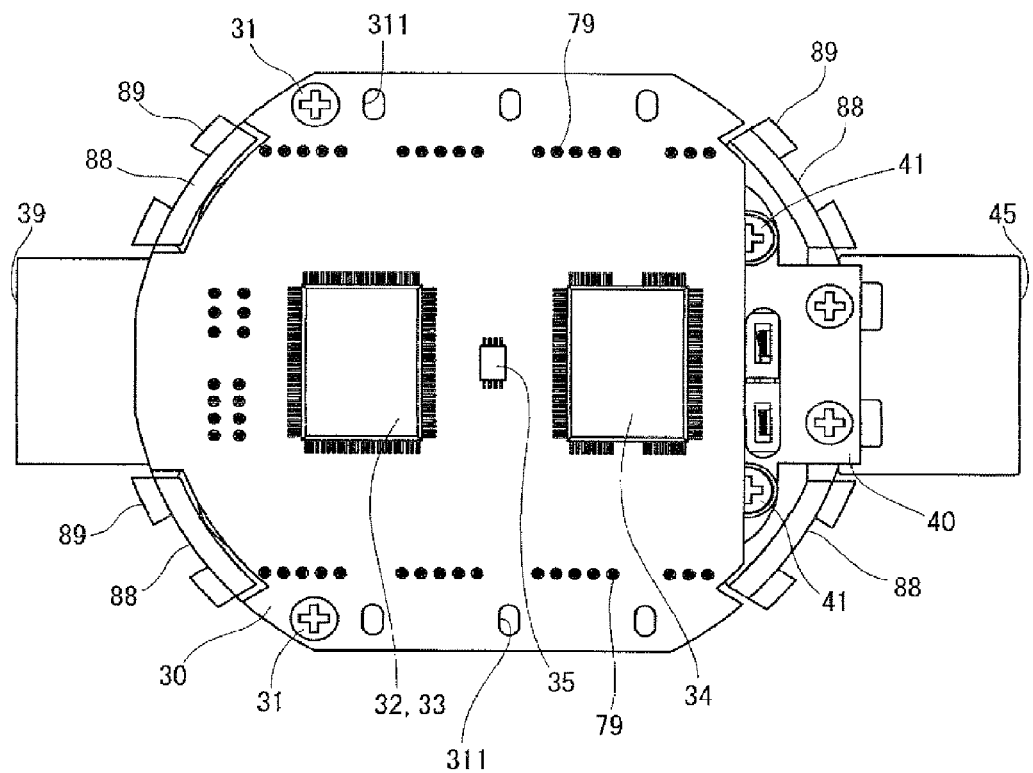
FIG. 18 is a bottom view showing the power module and a control board attached to the heat sink according to the first embodiment.
Figure 19:
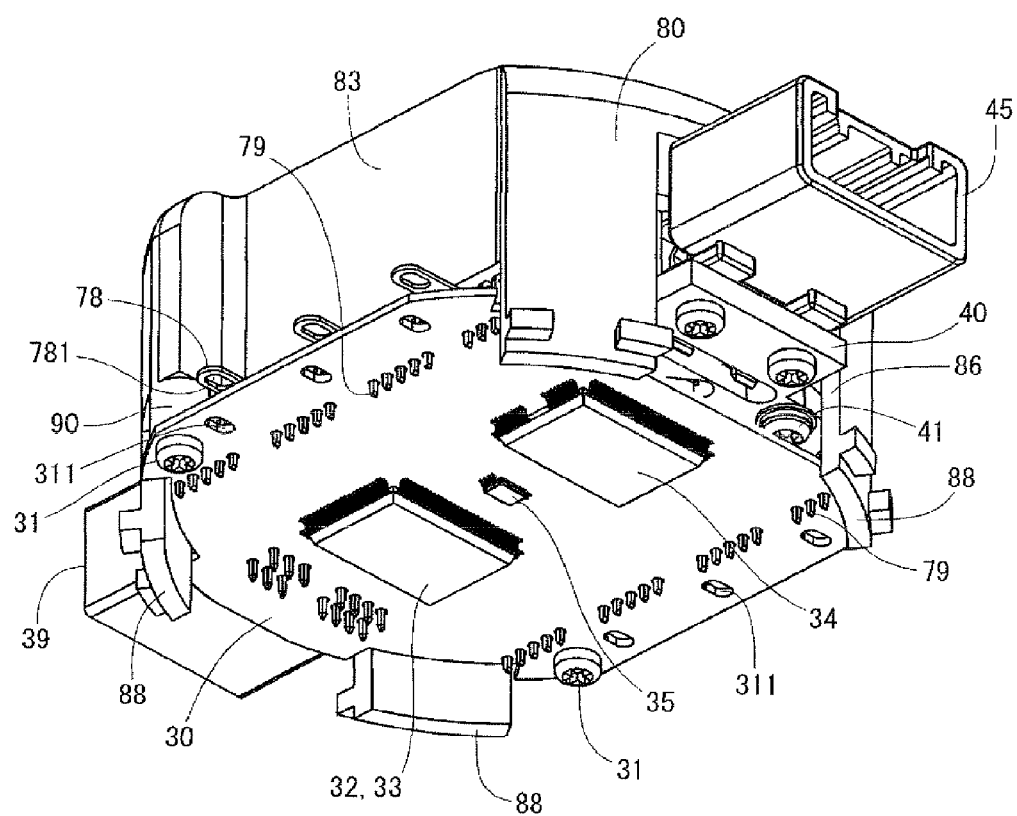
FIG. 19 is a perspective view showing the power module and the control board attached to the heat sink according to the first embodiment.

The heat sink 80 has a recess 82 in the central portion provided between the columnar members 84. Four screw holes 81 are formed around the recess 82. The power module 40 is attached to the heat sink 80 by screwing the screws 41 to the screw holes 81 as shown in FIGS. 16 and 17. At that time, the aluminum electrolytic capacitors 430, 431 and the choke coil 44 are accommodated in the recess 82.

The heat sink 80 has openings 86, 87 at positions corresponding to the power connector 45 of the power module 40 and a control connector 39 of the control board 30 (explained in detail later). The heat sink 80 has four support members 88 between the openings 86, 87 and the flat surface sections 83. The four support members 88 extend axially toward an electric motor side. Protrusions 89 are provided on end portions of the four support members 88. When the motorized equipment 10 is assembled, claws 121 of the first motor case 12 are inserted between the protrusions 89. Then, the claws 121 are bent to a circumferential direction to fix the heat sink 80 and the first motor case 12. Pillars 90 for fixing the control board 30 are provided on the bottom surface side of the heat sink 80.

The cover 91 is formed substantially in the shape of a cylinder with bottom from a magnetic material such as iron. The cover 91 is fixed by screws 92 to cover the heat sink 80. The cover 91 inhibits an electric field, which is generated by the power module 40, from leaking to an outside. The cover 91 also inhibits dust and the like from entering the controller.

As shown in FIGS. 1 to 4, 18 and 19, the control board 30 is provided on a second motor case 13 side of the power module 40 and substantially parallel to the power module 40. The control board 30 is electrically connected with the control terminals 79 protruding from the power module 40. The control connector 39 is provided to the control board 30 on a side opposite to the power connector 45 of the power module 40. The control board 30 has holes 311 for passing the extraction lines 19. The holes 311 are formed at positions axially overlapping with the holes 781 of the winding connection terminals 78 of the power module 40.

The control board 30 is mounted with a microcomputer 32, pre-drivers 33, a custom IC 34, a position sensor 35 and the like. The position sensor 35 is mounted on a second motor case 13 side of the control board 30. The position sensor 35 outputs a signal corresponding to a direction of a magnetic field generated by a magnet 29 provided on one end portion of the shaft 25.

As shown in FIG. 6, the custom IC 34 has a position sensor signal amplifier 36, a regulator 37 and a sensed current amplifier 38 as functional blocks. The signal outputted by the position sensor 35 is amplified by the position sensor signal amplifier 36 and is inputted to the microcomputer 32. Thus, the microcomputer 32 senses a position of the rotor 21 fixed to the shaft 25. The torque signal outputted from the torque sensor 4 and the like are inputted to the microcomputer 32 via the control connector 39. The currents of the inverter circuits sensed by the shunt resistances 76 are inputted to the microcomputer 32 via the sensed current amplifier 38.

(Actions)

Next, actions of the motorized equipment 10 will be explained. The microcomputer 32 on the control board 30 assists steering of the steering 3 according to vehicle speed based on the signals from the position sensor 35, the torque sensor 4, the shunt resistances 76 and the like. In order to do so, the microcomputer 32 produces pulse signals, which are formed by PWM control, through the pre-drivers 33.

The pulse signals are outputted to the two systems of the inverter circuits of the power module 40 via the control terminals 79. The two systems of the inverter circuits convert the direct-current power, which is supplied from the battery 5 via the choke coil 44 and the circuit protection power transistors 57, 58, 67, 68, into the three-phase alternating current power by switching operation of the power transistors 51-56, 61-66. The three-phase alternating current power is supplied to the windings 18 via the extraction lines 19 connected to the winding connection terminals 78. Thus, the electric motor rotates to generate the force for assisting the steering.

The heat generated by the power transistors 51-58, 61-68 during the switching operation is emitted from the radiation surfaces 59 of the land rows 71, 72 to the heat sink 80 through the insulation radiation sheets 69. Thus, failure and malfunction of the elements due to temperature increase can be prevented.

(Effects)

With the above-described construction, the motorized equipment 10 according to the first embodiment exerts following effects.

(1) The radiation surfaces 59 of the multiple lands can selectively dissipate the heats of the power transistors 51-58, 61-68 and the shunt resistances 76, which are the elements having large heat generation amounts and high cooling priorities. Therefore, a radiation efficiency improves as compared to the case where the heat dissipation of the entire substrate is performed equally. Accordingly, a size and weight of the heat sink 80 can be reduced.

(2) The insulation radiation sheet 69 is made of the insulative material. Therefore, short circuit among the multiple lands 710-729 through the heat sink 80 can be prevented.

(3) Since the first land row 71 and the second land row 72 are arranged on the same planes and the same straight lines respectively, outlines of the first and second land rows 71, 72 are simple. Therefore, a manufacturing cost of the insulation radiation sheet 69 can be reduced by cutting the rectangular sheet member having a predetermined width to the length corresponding to each of the land rows 71, 72 and by using the cut sheet as the insulation radiation sheet 69.

(4) The first land row 71 and the second land row 72 are provided on the same plane. Therefore, the thickness of the mold section 42 can be uniformed and the heights of the multiple lands 710-729 protruding from the mold section 42 can be uniformed. Thicknesses of the insulation radiation sheets 69 can be equalized and heights of the contact surfaces of the heat receiving sections 85 of the heat sink 80 can be equalized, so a manufacturing efficiency improves.

(5) The first land row 71 is arranged along the one long side portion of the rectangular power module 40, and the second land row 72 is arranged along the other long side portion of the power module 40. Therefore, the arrangement can be grasped at a glance for each system, thereby providing excellent visibility.

(6) Thicknesses of the heat receiving sections 85 of the heat sink 80 are made greater than the board thickness of the power module 40. Therefore, the volume necessary for receiving the heat can be secured effectively.

(7) The winding connection terminals 78 are connection terminals for large currents and have large sizes. Therefore, by forming the winding connection terminals 78 to extend to the outside of the side surfaces of the mold section 42, assembly workability is improved.

(8) Connecting work of the winding connection terminals 78 and the extraction lines 19 of the windings 18 is performed from the heat sink 80 side. At that time, the eyesight is not blocked by the outer wall of the heat sink, and work tools and the like do not interfere with the connecting work. Therefore, the assembly workability is improved.

(9) Since the recess 82 is formed in the central portion of the heat sink 80, the weight of the heat sink 80 can be reduced.

(10) The electrolytic capacitors 430, 431 and the choke coil 44 having the large body sizes are accommodated in the recess 82 of the heat sink 80. Accordingly, the space can be used effectively, and the body size of the motorized equipment 10 can be reduced.

Second Embodiment

Next, a semiconductor module according to a second embodiment of the present invention will be explained. The same sign is used for substantially the same component as the first embodiment. A power module 40r according to the second embodiment constitutes two systems of inverter circuits for driving a three-phase alternating current motor like the first embodiment. The power module 40r corresponds to the semiconductor module according to the present invention.

Figure 20A:
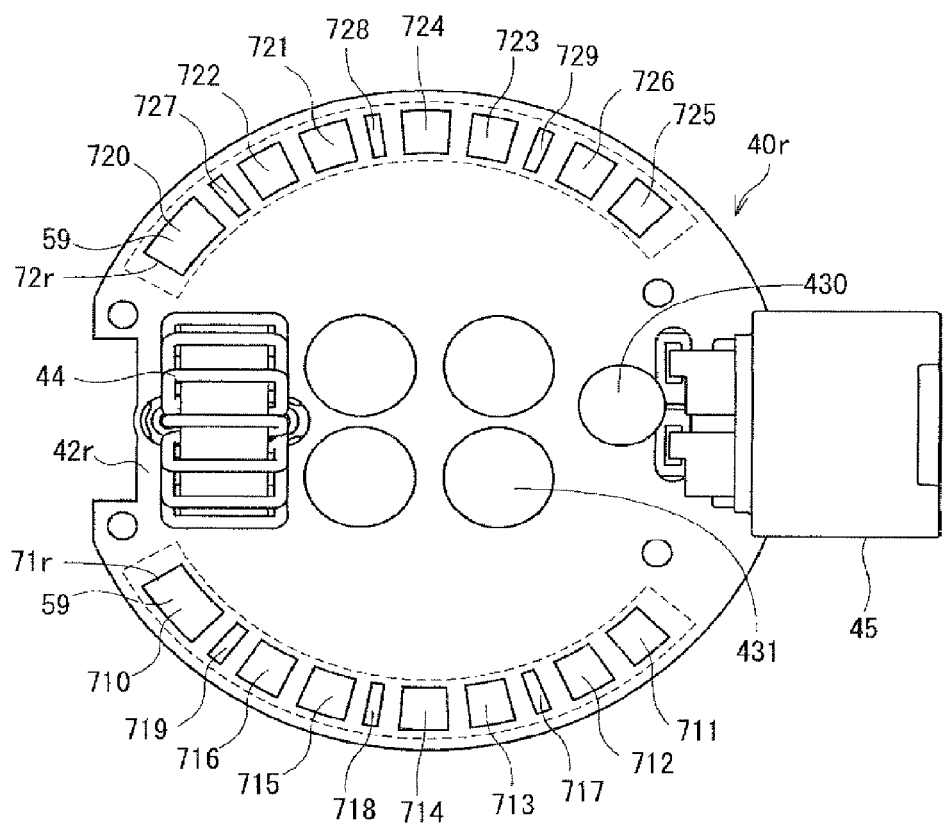
FIG. 20A is a plan view showing a power module and electronic components of a motorized equipment according to a second embodiment of the present invention.

In the second embodiment, a wiring board 70r and a mold section 42r of the power module 40r are formed in the round shapes as shown in FIG. 20A. The aluminum electrolytic capacitors 430, 431 and the choke coil 44 are arranged near a symmetrical axis passing through the power connector 45 on the mold section 42r. A first land row 71r for the first system is arranged on the same arc along an arc-shaped section of the power module 40r shown in a lower portion of FIG. 20A. A second land row 72r for the second system is arranged on the same arc along an arc-shaped section of the power module 40r shown in an upper portion of FIG. 20A. Constructions of the respective lands included in the first and second land rows 71r, 72r are the same as those of the first embodiment.

Figure 20B:
FIG. 20B is a plan view showing an insulation radiation sheet according to the second embodiment.

Insulation radiation sheets 69r are insulative thin plates and are formed in the arc-like shapes corresponding to sizes of the land rows 71r, 72r as shown in FIG. 20B. Surfaces of the insulation radiation sheets 69r on one side are in surface-to-surface contact with the radiation surfaces 59 of the land rows 71, 72. Surfaces of the insulation radiation sheets 69r on the other side are in surface-to-surface contact with the heat receiving sections 85 of the heat sink 80. The insulation radiation sheet 69r corresponds to the radiation member according to the present invention.

In the present embodiment, the wiring board 70r and the mold section 42r are formed in the round shapes. Therefore, outline shapes can be conformed to the outline shape of the first motor case 12, thereby improving mountability. In addition, the present embodiment exerts the same effects as those of the first embodiment.

Other Embodiments (a) In the above-described embodiments, the motorized equipment applied to the electric power steering system of the vehicle is explained as an example. Alternatively, the present invention may be applied to other uses than the electric power steering system.

(b) In the above-described embodiments, the semiconductor module used for the two systems of drive units for the three-phase alternating current motor is explained as an example. Alternatively, the present invention may be applied to a single system of a motor drive unit or three or more systems of motor drive units. Alternatively, the present invention may be applied to a system generating a multiple-phase alternating current power other than the three-phase alternating current power. The semiconductor chips mounted on the semiconductor module are not limited to the power transistors but may be other semiconductor devices.

(c) In the above-described embodiments, the first land row 71 and the second land row 72 are formed on the same plane. Alternatively, the first land row and the second land row may be formed on parallel planes having different heights respectively. Alternatively, the first land row and the second land row may be formed on planes, which are not parallel to each other. In any of these cases, contact surfaces of the radiation members or the heat sink are provided to be able to contact the radiation surfaces of the respective lands at the same time. With such the construction, erroneous assembly of the heat sink and the semiconductor module in an assembling direction can be prevented, for example.

(d) In the above-described embodiments, the flat surface section 83 substantially perpendicular to the heat receiving section 85 is formed as the outer wall of the heat sink on the winding connection terminal side. However, the outer wall on the winding connection terminal side is not limited to the flat surface but may be a curved surface. Alternatively, concavities and convexities may be formed on the surface to improve the radiation effect.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A semiconductor module comprising:
a semiconductor chip for switching energization of a winding related to drive of a motor;
a wiring board that is mounted with the semiconductor chip and that has an energization route routed through the semiconductor chip;
a mold section that is formed from a resin in the shape of a plate such that the semiconductor chip and the wiring board are embedded in the mold section;
a winding connection terminal extending from the wiring board to an outside of the mold section, the winding connection terminal being connected with the winding;
a control terminal extending from the wiring board to the outside of the mold section, the control terminal being connected with a control board that controls the energization of the winding; and
a plurality of lands provided on a side of the wiring board opposite to the semiconductor chip, the lands having radiation surfaces exposed from the mold section and being capable of dissipating a heat, which is generated by the semiconductor chip, by establishing surface-to-surface contact between the radiation surfaces and a radiation member, wherein
the lands constitute a land row, in which the radiation surfaces are arranged on the same plane and on a straight line.

2. The semiconductor module as in claim 1, wherein the radiation surfaces are provided on the same plane.

3. The semiconductor module as in claim 1, wherein the lands are arranged along side portions of the wiring board.

4. The semiconductor module as in claim 1, wherein the winding connection terminal extends from a side portion of the wiring board to an outside of a side surface of the mold section.

5. The semiconductor module as in claim 1, further comprising:
a shunt resistance that is mounted to the wiring board and embedded in the mold section for sensing a current flowing through the winding, wherein
the lands are provided on a side of the wiring board opposite to the shunt resistance and are capable of dissipating a heat generated by the shunt resistance.

6. A motorized equipment comprising:
a stator, around which a winding is wound to form a plurality of phases;
a rotor provided radially inside the stator to be rotatable relative to the stator;
a control board provided on an axial side of the rotor along a plane perpendicular to an axis of the rotor for controlling energization of the winding;
the semiconductor module as in claim 1;
a radiation member made of an insulative material to be in surface-to-surface contact with the radiation surfaces of the plurality of lands of the semiconductor module; and
a heat sink made of a thermally-conductive material to be in surface-to-surface contact with a side of the radiation member opposite to the semiconductor module, the heat sink being capable of receiving a heat generated by the semiconductor module.

7. The motorized equipment as in claim 6, wherein the heat sink has a heat receiving section in surface-to-surface contact with the radiation member, the heat receiving section having a thickness greater than a board thickness of the semiconductor module.

8. The motorized equipment as in claim 6, wherein the heat sink has an outer wall on a winding connection terminal side, the outer wall being provided on a wiring board side with respect to a connection between the winding connection terminal and an extraction line of the winding.

9. A semiconductor module comprising:
a semiconductor chip for switching energization of a winding related to drive of a motor;

a wiring board that is mounted with the semiconductor chip and that has an energization route routed through the semiconductor chip;

a mold section that is formed from a resin in the shape of a plate such that the semiconductor chip and the wiring board are embedded in the mold section;

a winding connection terminal extending from the wiring board to an outside of the mold section, the winding connection terminal being connected with the winding;

a control terminal extending from the wiring board to the outside of the mold section, the control terminal being connected with a control board that controls the energization of the winding; and a plurality of lands provided on a side of the wiring board opposite to the semiconductor chip, the lands having radiation surfaces exposed from the mold section and being capable of dissipating a heat, which is generated by the semiconductor chip, by establishing surface-to-surface contact between the radiation surfaces and a radiation member, wherein the lands constitute a land row, in which the radiation surfaces are arranged on the same plane and on an arc.

10. The semiconductor module as in claim 9, wherein the radiation surfaces are provided on the same plane.

11. The semiconductor module as in claim 9, further comprising:

a shunt resistance that is mounted to the wiring board and embedded in the mold section for sensing a current flowing through the winding, wherein the lands are provided on a side of the wiring board opposite to the shunt resistance and are capable of dissipating a heat generated by the shunt resistance.

12. A motorized equipment comprising:

a stator, around which a winding is wound to form a plurality of phases;

a rotor provided radially inside the stator to be rotatable relative to the stator;

a control board provided on an axial side of the rotor along a plane perpendicular to an axis of the rotor for controlling energization of the winding;

the semiconductor module as in claim 9;

a radiation member made of an insulative material to be in surface-to-surface contact with the radiation surfaces of the plurality of lands of the semiconductor module; and a heat sink made of a thermally-conductive material to be in surface-to-surface contact with a side of the radiation member opposite to the semiconductor module, the heat sink being capable of receiving a heat generated by the semiconductor module.

13. The motorized equipment as in claim 12, wherein the heat sink has a heat receiving section in surface-to-surface contact with the radiation member, the heat receiving section having a thickness greater than a board thickness of the semiconductor module.

14. The motorized equipment as in claim 12, wherein the heat sink has an outer wall on a winding connection terminal side, the outer wall being provided on a wiring board side with respect to a connection between the winding connection terminal and an extraction line of the winding.

* * * * *